United States Patent
Ito et al.

(10) Patent No.: US 6,434,730 B1
(45) Date of Patent: Aug. 13, 2002

(54) PATTERN FORMING METHOD

(75) Inventors: Mitsumi Ito, Kyoto; Hiroyuki Tsujikawa, Shiga; Seijiro Kojima, Kyoto; Masatoshi Sawada, Shiga, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/484,022

(22) Filed: Jan. 18, 2000

(30) Foreign Application Priority Data

Jan. 19, 1999 (JP) .................................. 11-010010

(51) Int. Cl.[7] .............................................. G06F 17/50
(52) U.S. Cl. .................................. 716/8; 716/9; 716/10
(58) Field of Search .......................... 716/1–18; 438/5, 438/129, 110, 128, 130, 238, 284, 286; 361/306.2; 257/197, 202, 205, 207, 208, 211, 296, 306, 379, 390, 401, 528, 532, 565, 698, 758, 773

(56) References Cited

U.S. PATENT DOCUMENTS 5,237,184 A  *  8/1993  Yonemaru et al. ............ 257/202
5,817,533 A       10/1998  Sen et al.
6,034,383 A  *  3/2000  Bayraktaroglu ............ 257/197
6,232,154 B1 *  5/2001  Reith et al. ................. 438/129

FOREIGN PATENT DOCUMENTS

| JP | 5-48020 | 2/1993 |
| JP | 5-283615 | 10/1993 |
| JP | 8-32024 | 2/1996 |
| JP | 9-181373 | 7/1997 |
| JP | 11-26590 | 1/1999 |

* cited by examiner

Primary Examiner—Caridad Everhart
Assistant Examiner—Naum Levin
(74) Attorney, Agent, or Firm—McDermott, Will & Emery

(57) ABSTRACT

After a layout for a semiconductor device including power and ground lines has been defined, patterns for bypass capacitors, which will be located under the power lines, are created. In this case, a pattern for a semiconductor device, where a bypass capacitor array is inlaid and substrate contacts are located under ground lines, is defined based on design rules input. Next, power lines are extracted and resized. Thereafter, logical operations are performed to place the bypass capacitors and the bypass capacitors are resized. Subsequently, logical operations are performed to define interconnecting diffused layers and the diffused layers are resized. Since the patterns for the power lines have already been defined before the patterns for the bypass capacitors are created, the patterns for the bypass capacitors to be placed under the power lines can be defined automatically. Thus, a pattern for a miniaturized semiconductor device with reduced power supply noise can be created automatically.

8 Claims, 12 Drawing Sheets

PATTERN FORMING METHOD

BACKGROUND OF THE INVENTION

The present invention relates to a method for forming a layout pattern for a semiconductor device including cells and bypass capacitors with an MOS structure.

As the operating frequency of a present-day LSI has been increasing, a ratio of noise to signal has also been rising in transistors within the LSI. To eliminate the noise as much as possible, various techniques have been proposed.

According to an exemplary noise reduction technique, a bypass capacitor is placed between power and ground lines to cut down the noise component of the power supply.

However, a technique of placing a bypass capacitor at an appropriate location has not been established yet in fabricating a semiconductor device following a pattern that has been created in advance by some physical design technique using basic cells, for example. Thus, there is a strong demand for a method of creating an optimum pattern for a semiconductor device automatically while taking not only noise, but also various characteristics of the device, such as the number of devices integrated per unit area, into account.

SUMMARY OF THE INVENTION

An object of the present invention is providing a method of defining an optimum layout pattern automatically, which is best suited to a miniaturized, noise-reduced semiconductor device, to cope with everlasting downsizing and tremendous increase in operating frequency of semiconductor devices.

An inventive pattern forming method is adapted to form a layout pattern for a semiconductor device automatically. The method includes the steps of: a) defining a layout, which includes a pattern for a cell with an MIS structure and patterns for power and ground lines, over a semiconductor substrate; and b) automatically creating patterns for bypass capacitors with an MIS structure such that the patterns for the capacitors overlap with the pattern for the power line. Each said bypass capacitor includes the semiconductor substrate, a capacitive insulating film and an electrode.

According to this method, the pattern for the power line has already been created before the patterns for the bypass capacitors are defined. Thus, the patterns for the bypass capacitors can be defined automatically so as to be included in the pattern for the power line. That is to say, a densely integrated and noise-reduced semiconductor device can be fabricated based on automatically created patterns.

In one embodiment of the present invention, a pattern for a first diffused layer, which is provided on right- and left-hand sides of the electrode, may be included in the pattern for each said bypass capacitor. And the ground line may be connected to a second diffused layer in the semiconductor substrate via substrate contacts. In this particular embodiment, the method preferably further includes the step of c) creating a pattern for a third diffused layer interconnecting the first diffused layer of the bypass capacitors and the second diffused layer together.

In this method, the pattern for the first diffused layer is included in the pattern for each bypass capacitor. Accordingly, it is possible to recognize the bypass capacitor as an equivalent to an MIS transistor in the cell, thus facilitating the automated pattern formation process. In addition, since the ground line is connected to the second diffused layer in the semiconductor substrate via the substrate contacts, a pattern for a structure including a highly latch-up resistant cell can be obtained. Moreover, by defining the pattern for the third diffused layer, the bypass capacitors, along with the low-resistance diffused layer, can be interposed between the power and ground lines. That is to say, a pattern obtained in this manner is applicable to fabricating a semiconductor device that can greatly reduce unwanted radiative noise involved with radio frequency operation.

In an alternate embodiment, the step b) may include the sub-steps of: x) preparing a pattern for an array of bypass capacitors; y) extracting the pattern for the power line from the layout; and z) superimposing the pattern for the power line on the pattern for the bypass capacitor array and extracting, as the patterns for the bypass capacitors, part of the pattern for the bypass capacitor array that overlaps with the pattern for the power line. In this manner, automated pattern formation process can be simplified.

In this particular embodiment, patterns for two types of bypass capacitor arrays may be prepared in the sub-step x). Each of the patterns may be in the form of a rectangle where the electrodes of the bypass capacitors extend in a predetermined direction. And the direction in which the electrodes extend in one of the two patterns may cross at right angles with the direction in which the electrodes extend in the other pattern. In this case, the patterns for the bypass capacitors may be defined in the sub-step z) such that the electrodes of the bypass capacitors are parallel to the power line.

In an alternative embodiment, patterns for two types of bypass capacitor arrays may also be prepared in the sub-step x). Each of the patterns may be in the form of a rectangle where the electrodes of the bypass capacitors extend in a predetermined direction. And the direction in which the electrodes extend in one of the two patterns may cross at right angles with the direction in which the electrodes extend in the other pattern. In this case, the patterns for the bypass capacitors may be defined in the sub-step z) by rotating the bypass capacitors in such a direction as maximizing the area of an interconnecting diffused layer.

In another alternative embodiment, a single pattern for the bypass capacitor array may be prepared in the sub-step x). The pattern may be in the form of a rectangle where the electrodes of the bypass capacitors extend in a predetermined direction. In this case, the patterns for the bypass capacitors may be defined in the sub-step z) such that the electrodes of some of the bypass capacitors are parallel to the power line and the electrodes of the other bypass capacitors cross at right angles with the power line.

In still another embodiment, each said electrode may be ringlike, and the first diffused layer may exist in a region surrounded by the electrodes and in a region outside of the electrodes in the pattern prepared in the sub-step x) for the bypass capacitor array. In this manner, bypass capacitors of the same shape can be placed irrespective of the direction in which the power lines extend.

DESCRIPTION OF THE PREFERRED EMBODIMENTS

Hereinafter, preferred embodiments of the present invention will be described with reference to the accompanying drawings.

EMBODIMENT 1

Figure 1:
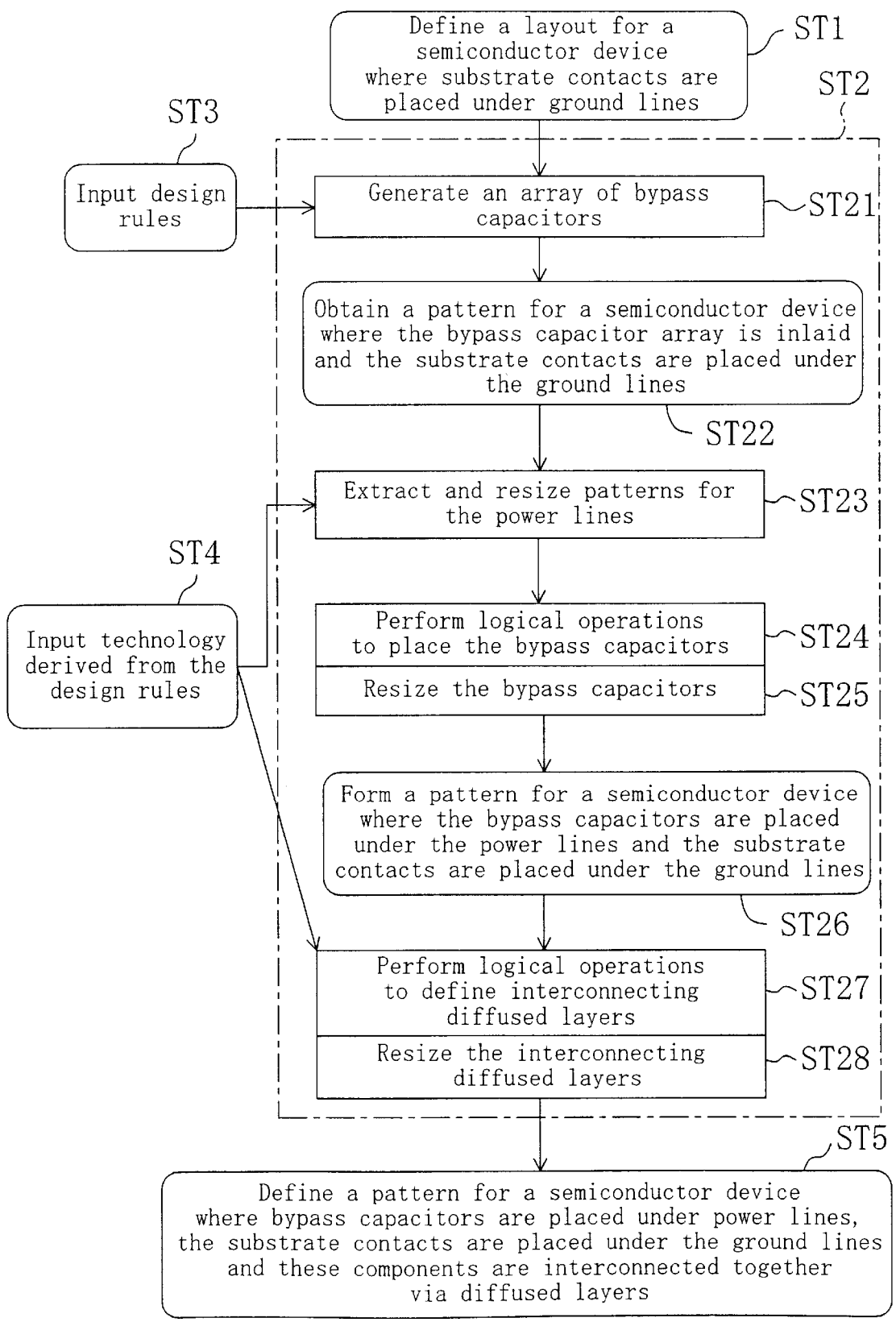
FIG. 1 is a flowchart illustrating part of a semiconductor device design process according to the present invention with a detailed procedure of forming a pattern for a bypass capacitor.

FIG. 1 is a flowchart illustrating part of a semiconductor device design process according to a first exemplary embodiment of the present invention with a detailed procedure of forming a pattern for a bypass capacitor. A semiconductor device fabrication process will be outlined with reference to FIG. 1.

First, in Step ST1, a layout where substrate contacts are provided under ground lines is defined. At this point in time, a pattern shown in FIG. 2 has been created for the semiconductor device.

Next, in Step ST2, which consists of Sub-steps ST21 through ST28, a pattern for a bypass capacitor is formed. During this processing step, design rules are input in Step ST3 and technology that has been derived from the design rules is input in Step ST4. Finally, in Step ST5, a pattern for the semiconductor device, where bypass capacitors are located under power lines, substrate contacts are located under ground lines and these components are interconnected together via diffused layers, is defined. In this specification, the "technology" input in Step ST4 means the sizes of respective components including cells, bypass capacitors and lines that have been defined to meet the design rules.

Hereinafter, the respective sub-steps included in Step ST2 will be described.

Figure 3A:
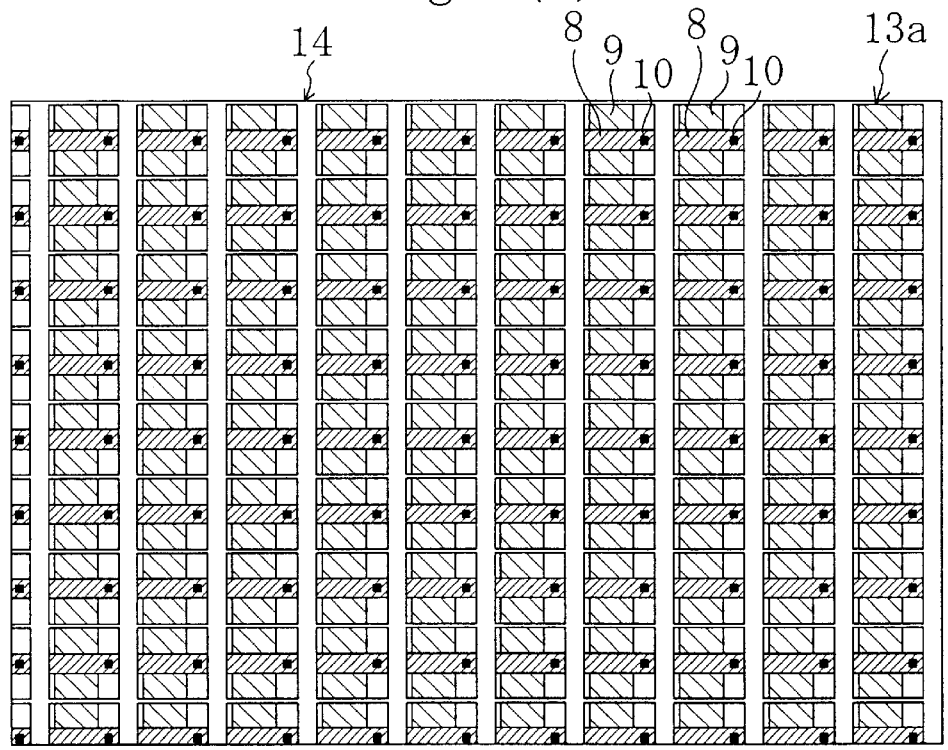
FIGS. 3(a) and 3(b) are plan views illustrating bypass capacitor arrays defined according to a first embodiment of the present invention.
Figure 3B:
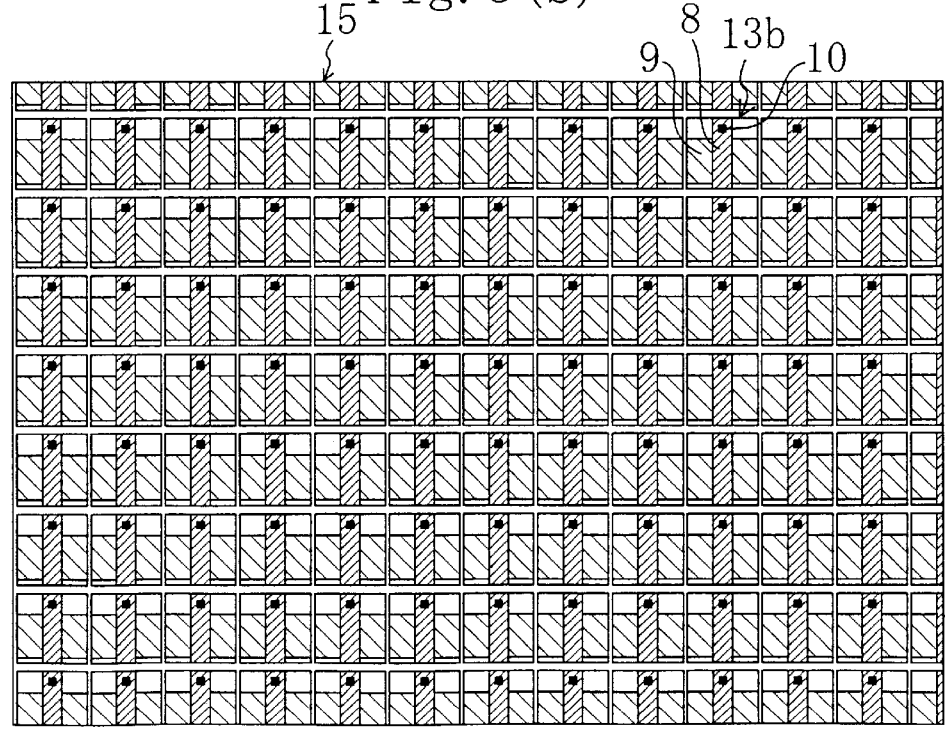

First, in Sub-step ST21, the size of each bypass capacitor is determined based on the design rules input in Step ST3. Also, the size of the chip is estimated based on the results of Step ST1. In addition, the number of bypass capacitors arrangeable in columns and rows within the chip is calculated based on the design rules, thereby generating arrays of bypass capacitors with such an arrangement as shown in FIGS. 3(a) and 3(b). Next, in Sub-step ST22, a pattern for a semiconductor device, where the bypass capacitor array is inlaid and substrate contacts are located under the ground lines, is obtained.

Figure 4A:
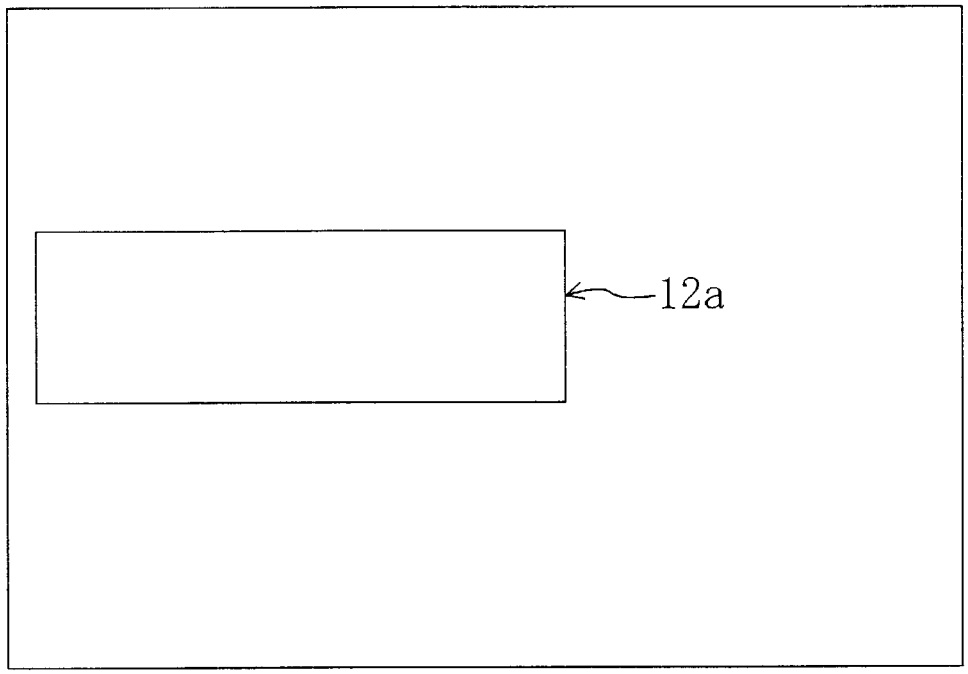
FIGS. 4(a) and 4(b) are plan views illustrating virtual power line patterns that are extracted in a virtual pattern forming region in the first embodiment.
Figure 4B:
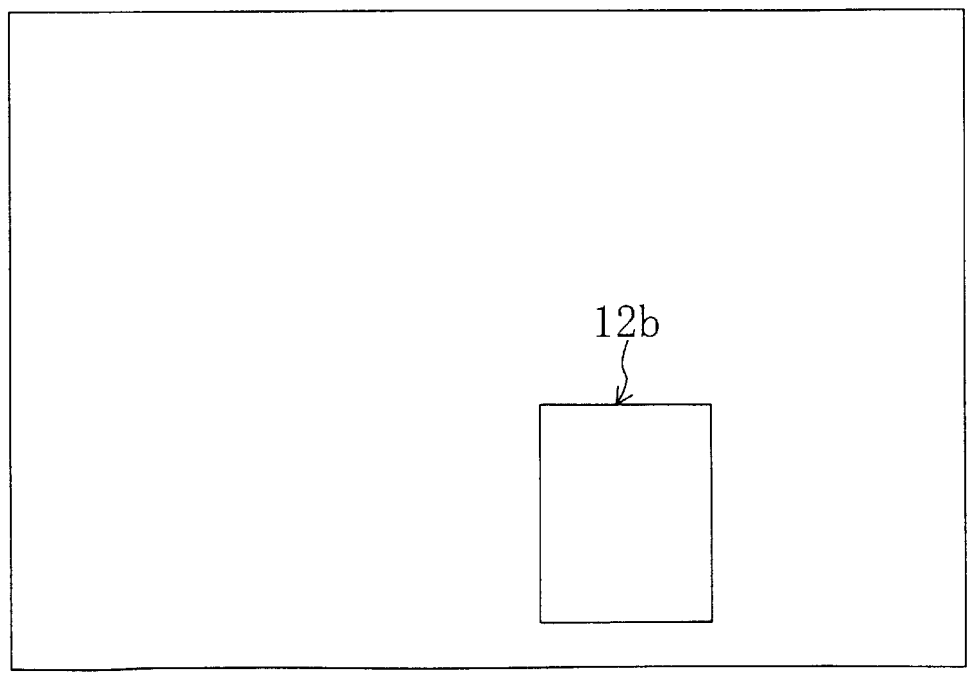

Then, in Sub-step ST23, the technology that has been derived from the design rules is input and patterns for the power lines are extracted and resized as shown in FIGS. 4(a) and 4(b). Subsequently, in Sub-step ST24, logical operations are performed to place the bypass capacitors. Thereafter, in Sub-step ST25, the bypass capacitors are resized.

Next, in Sub-step ST26, a pattern for the semiconductor device, where bypass capacitors are located under the power lines and the substrate contacts are located under the ground lines, is formed.

Thereafter, logical operations are performed to define interconnecting diffused layers in Sub-step ST27 and then the diffused layers are resized in Sub-step ST28.

Hereinafter, these processing steps and sub-steps will be described in further detail with reference to respective patterns formed through this processing.

Figure 2:
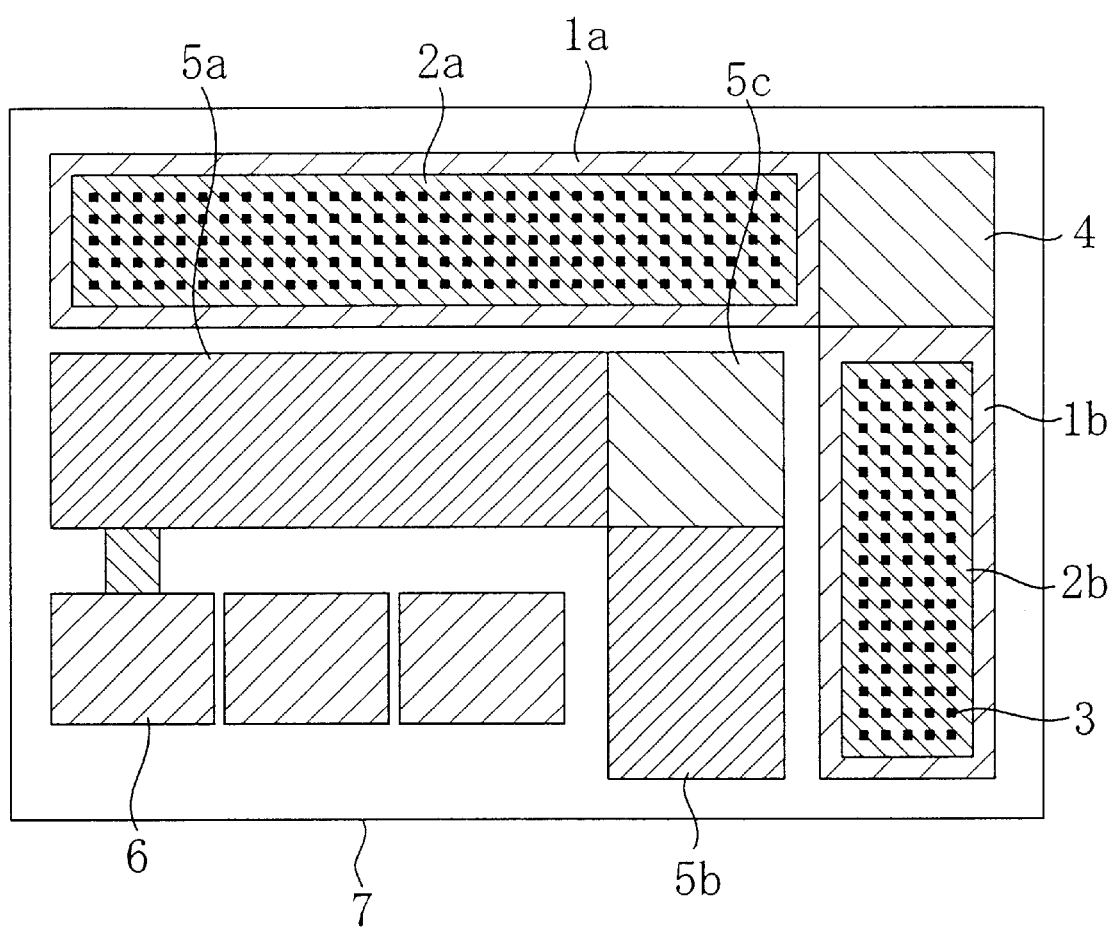
FIG. 2 illustrates a pattern for a semiconductor device after patterns for power and ground lines have already been defined but before a pattern for a bypass capacitor has not been formed yet.

FIG. 2 illustrates a planar layout for a semiconductor device that is defined in Step ST1. At this point in time, the cells and lines have already been placed as a result of a semiconductor device design process. As shown in FIG. 2, respective patterns for ground lines 1a, 1b, power lines 5a, 5b and cells 6 have been defined over a substrate 7. More specifically, these patterns are defined in the following manner.

The ground lines include horizontal and vertical ground lines 1a and 1b extending horizontally and vertically in FIG. 2, respectively. Under these ground lines 1a and 1b, diffused layers 2a and 2b for substrate contacts are defined as respective regions for ensuring a ground potential for the substrate 7. Also, through holes 3 for substrate contacts are defined to interconnect the ground lines 1a, 1b to the diffused layers 2a, 2b, respectively. Furthermore, a ground line interchanging through hole 4 is defined at an intersection between the horizontal and vertical ground lines 1a and 1b to electrically connect these lines together. The diffused layers 2a, 2b and through holes 3 for substrate contacts may be defined as disclosed in Japanese Patent Application No. 9-181373.

The power lines also include horizontal and vertical power lines 5a and 5b extending horizontally and vertically in FIG. 2, respectively. A power line interchanging through hole 5c is defined at an intersection between the horizontal and vertical power lines 5a and 5b to electrically connect these lines together.

FIGS. 3(a) and 3(b) are plan views illustrating the bypass capacitor arrays defined in Sub-step ST21 of Step ST2. In the illustrated embodiment, two types of bypass capacitor arrays 14 and 15 are prepared. In one (i.e., the bypass capacitor array 14) of these two types of bypass capacitor arrays, multiple bypass capacitors, each including a polysilicon electrode extending in the same direction as the horizontal power line 5a, are arranged in columns and rows as shown in FIG. 3(a). In the other bypass capacitor array 15 on the other hand, multiple bypass capacitors, each including a polysilicon electrode extending in the same direction as the vertical power line 5b, are arranged in columns and rows as shown in FIG. 3(b). As illustrated, each bypass capacitor in the bypass capacitor arrays 14 and 15 includes polysilicon electrode 8, bypass capacitor diffused layer 9, which is equivalent to the first diffused layer, and bypass capacitor through hole 10. And each bypass capacitor is surrounded by a frame 13a and 13b. Using these bypass capacitors, the logical operations performed in Sub-step ST24 to place the bypass capacitors and the resizing processing performed in Sub-step ST28 to define the interconnecting diffused layer are facilitated.

It should be noted that the bypass capacitor diffused layer 9 does not have to be provided. However, if the bypass capacitor diffused layer 9 is provided, then the bypass capacitor has the same structure as an MOS transistor. In that case, the bypass capacitor is recognizable as an equivalent to an MOS transistor and the same processing can be performed on both MOS transistors and bypass capacitors alike. Also, as will be described later, since the resistance can be reduced, unwanted radiation can also be suppressed. In the illustrated embodiment, the respective sizes of the polysilicon electrode 8, diffused layer 9 and through hole 10 of each bypass capacitor are equalized with those of the gate electrode, source/drain diffused layer and gate contact of an MOS transistor (none of them are shown).

FIGS. 4(a) and 4(b) are plan views illustrating virtual power line patterns that are extracted in a virtual pattern forming region in Sub-step ST23 of Step ST2. First, a pattern free from obstacles (not shown) is formed by eliminating the power line interchanging through hole 4 from the power lines for the semiconductor device. Next, only the vertical sides of such an obstacle-free power line pattern are moved in the negative direction over a distance corresponding to the minimum line width of the power line that is defined by the technology derived based on the design rules. These sides are moved using a side resizing function such as layout verification tool. As a result, parts of the pattern for the vertical sides of the power lines are erased. Then, only the vertical sides of the remaining power line pattern are moved in the positive direction over the distance corresponding to the minimum line width of the power line, thereby extracting a horizontal virtual power line pattern 12a shown in FIG. 4(a). Similarly, by moving the horizontal sides of such an obstacle-free power line pattern in the negative direction and then in the positive direction over the distance corresponding to the minimum line width of the power line, a vertical virtual power line pattern 12b shown in FIG. 4(b) can be extracted.

Figure 5A:
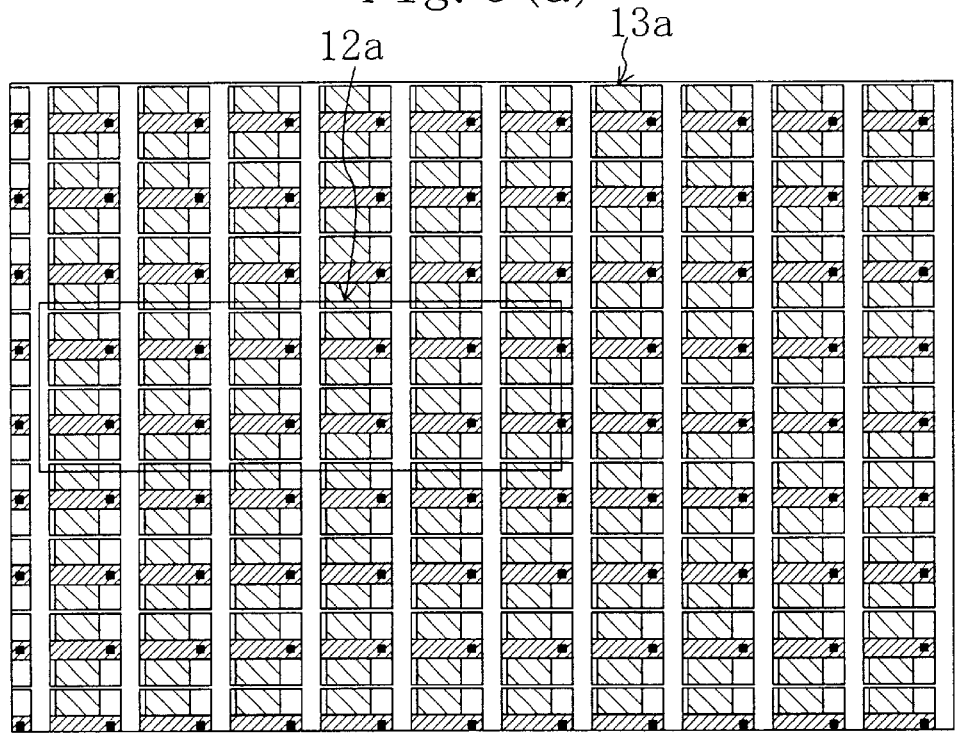
FIGS. 5(a) and 5(b) are plan views illustrating how the virtual power line patterns extracted in the virtual pattern forming region overlap with the bypass capacitor array patterns in the first embodiment.
Figure 5B:
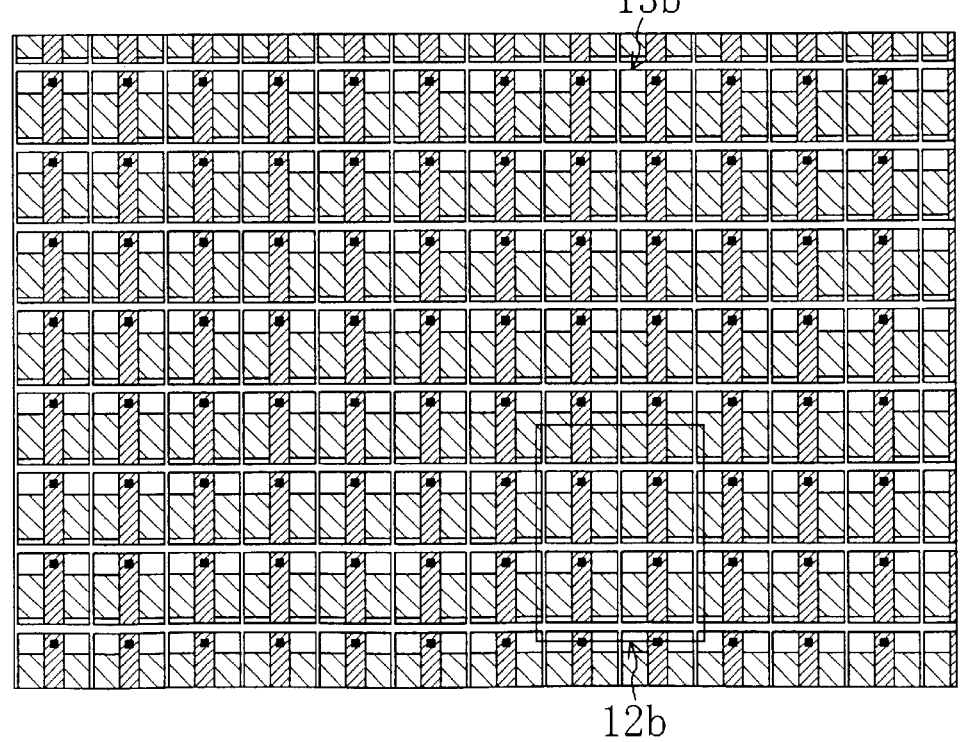

FIGS. 5(a) and 5(b) are plan views illustrating how the virtual power line patterns 12a and 12b extracted in the virtual pattern forming region in Sub-step ST24 of Step ST2 overlap with the bypass capacitor array patterns 14 and 15, respectively. First, logical operations (i.e., multiplication) are performed on the horizontal virtual power line pattern 12a shown in FIG. 4(a) and the frames 13a of the horizontally arranged bypass capacitors in the array 14 shown in FIG. 3(a). In this manner, bypass capacitors overlapping with the horizontal virtual power line pattern 12a are extracted as shown in FIG. 5(a). Also, logical operations (i.e., multiplication) are performed on the vertical virtual power line pattern 12b shown in FIG. 4(b) and the frames 13b of the vertically arranged bypass capacitors in the array 15 shown in FIG. 3(b). In this way, bypass capacitors overlapping with the vertical virtual power line pattern 12b are extracted as shown in FIG. 5(b).

Figure 6A:
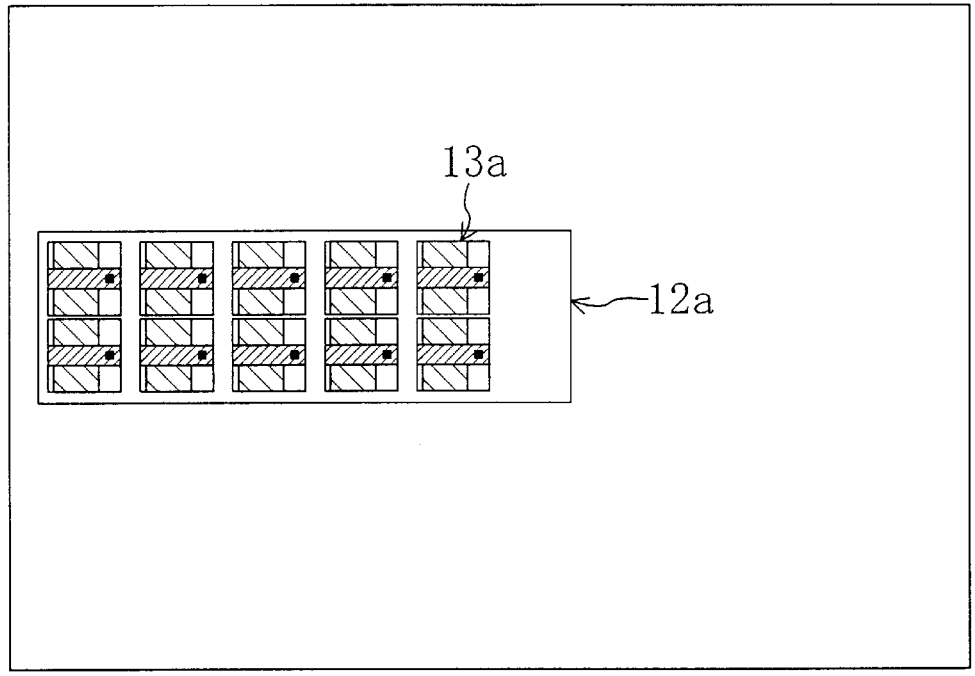
FIGS. 6(a) and 6(b) are plan views illustrating a pattern, where only the bypass capacitor frames, which are completely included in the associated virtual power line patterns, are left in the virtual pattern forming region in the first embodiment.
Figure 6B:
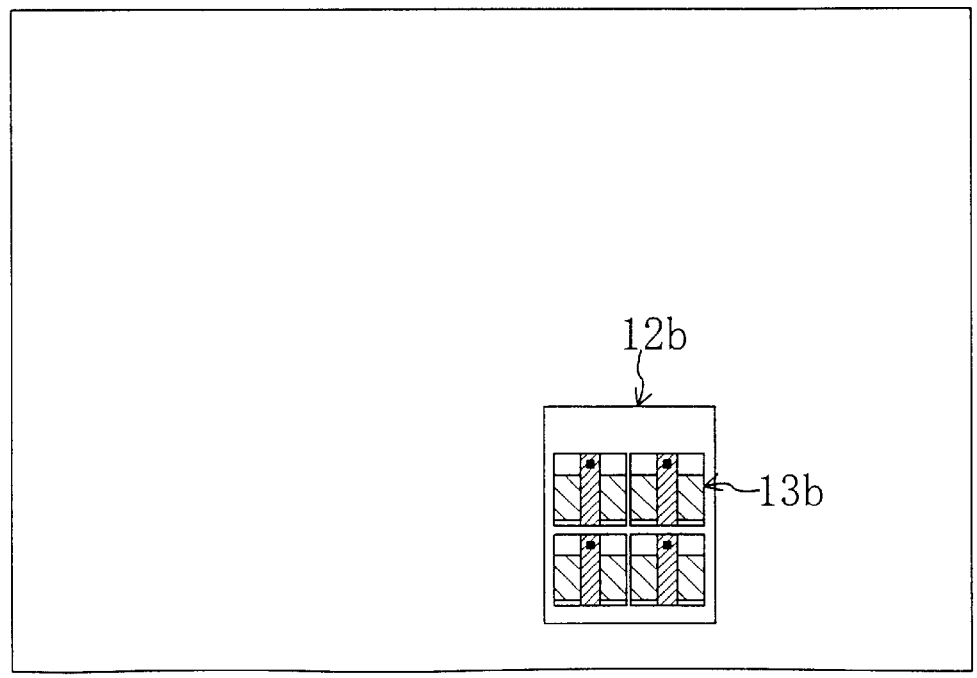

FIGS. 6(a) and 6(b) are plan views illustrating a pattern obtained in Sub-step ST25 of Step ST2, where only the bypass capacitor frames 13a, 13b, which are completely included in the associated virtual power line patterns 12a, 12b, are left in the virtual pattern forming region. In Sub-step ST25, half of the minimum width of the bypass capacitor frames 13a and 13b is defined as an item of the technology, and the bypass capacitor frames 13a and 13b are resized, i.e., scaled down or up. In this manner, tiny bypass capacitor patterns are erased and only the bypass capacitor frames 13a, 13b that are completely included in the virtual power line patterns 12a, 12b are left.

In the illustrated embodiment, only the bypass capacitor frames 13a, 13b that are completely included in the virtual power line patterns 12a, 12b are left in Sub-step ST25 of Step ST2. The present invention, however, is in no way limited to such a specific embodiment. For example, only the bypass capacitors, of which the polysilicon electrodes 8 are completely included in the respective virtual power line patterns 12a, 12b, may be left in the state shown in FIGS. 6(a) and 6(b). Alternatively, bypass capacitors with a certain percentage of their frame 13a or 13b included within the patterns 12a, 12b may be left.

Figure 7A:
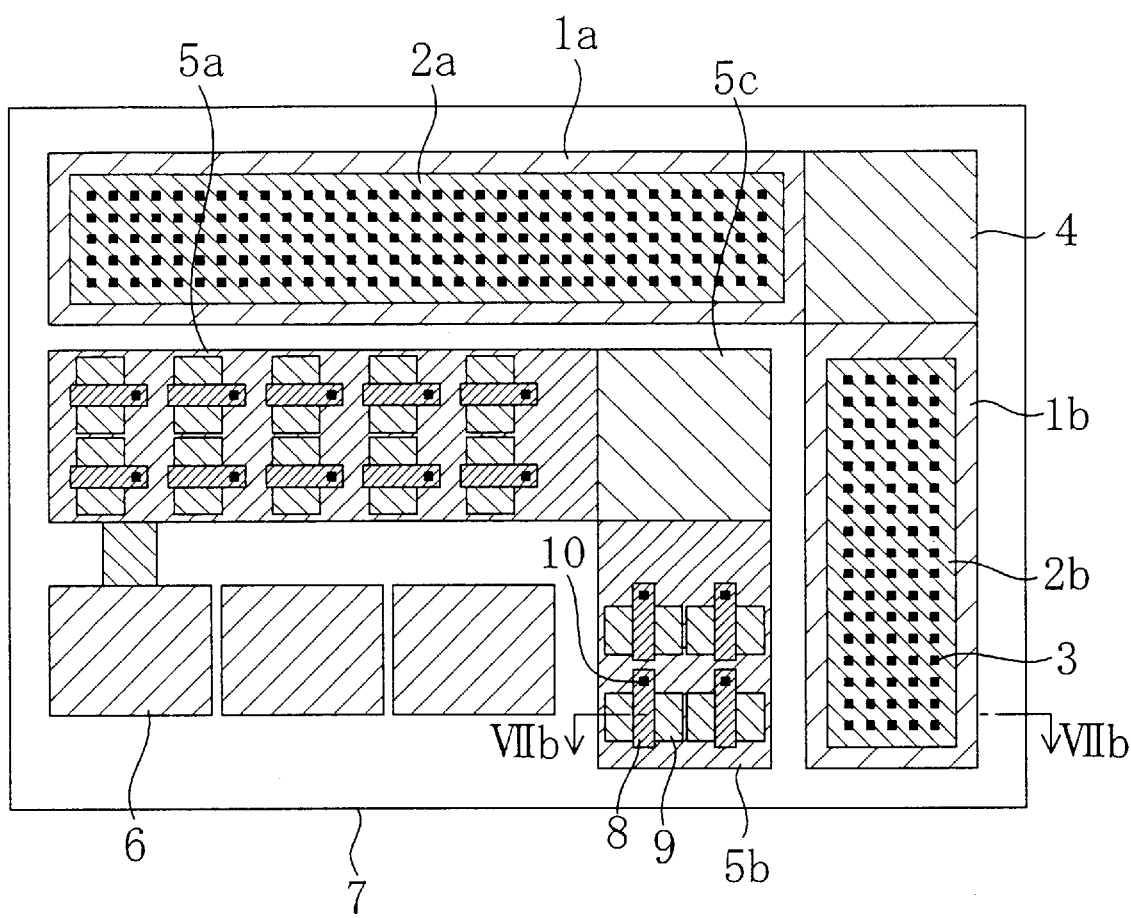
FIG. 7(a) is a plan view illustrating a pattern for a semiconductor device before a pattern for an interconnecting diffused layer is defined in the virtual pattern forming region in the first embodiment.
Figure 7B:
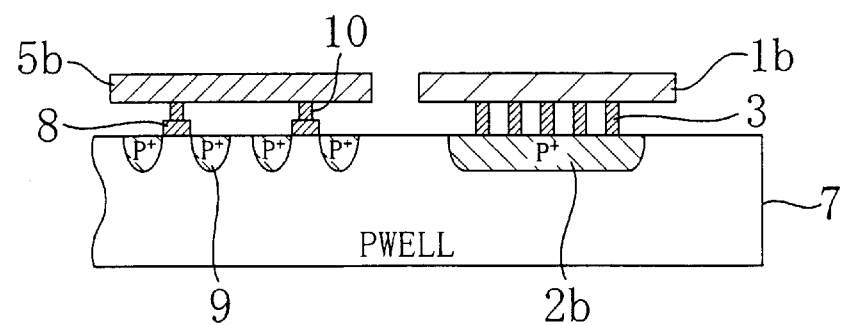
FIG. 7(b) is a partial cross-sectional view of the device taken along the line VIIb—VIIb in FIG. 7(a).

FIG. 7(a) is a plan view illustrating a pattern for a semiconductor device that is formed in Sub-step ST26 of Step ST2. FIG. 7(b) is a partial cross-sectional view of the device taken along the line VIIb-VIIb in FIG. 7(a).

Specifically, the pattern shown in FIG. 7(a) for the semiconductor device is obtained by leaving only the bypass capacitor frames 13a, 13b, which are completely included within the virtual power line patterns 12a, 12b shown in FIGS. 6(a) and 6(b), under the power lines 5a, 5b of the semiconductor device where the bypass capacitor array is inlaid.

As shown in FIG. 7(b), $p^+$-type diffused layers 2a, 2b for substrate contacts are defined in the p-well within the substrate 7, and through holes 3 for substrate contacts are also defined to interconnect the diffused layers 2a, 2b and ground lines 1a, 1b together. Furthermore, under the power lines 5a, 5b, the bypass capacitor polysilicon electrodes 8 and through holes 10 interconnecting the polysilicon electrodes 8 and power lines 5a, 5b together are defined, and $p^+$-type bypass capacitor diffused layers 9 are defined within the p-well.

At this point in time, the pattern for the capacitive insulating film of the bypass capacitors has not be defined yet, but may be defined afterward as the same pattern as that of the gate oxide film for MOS transistors.

Figure 8A:
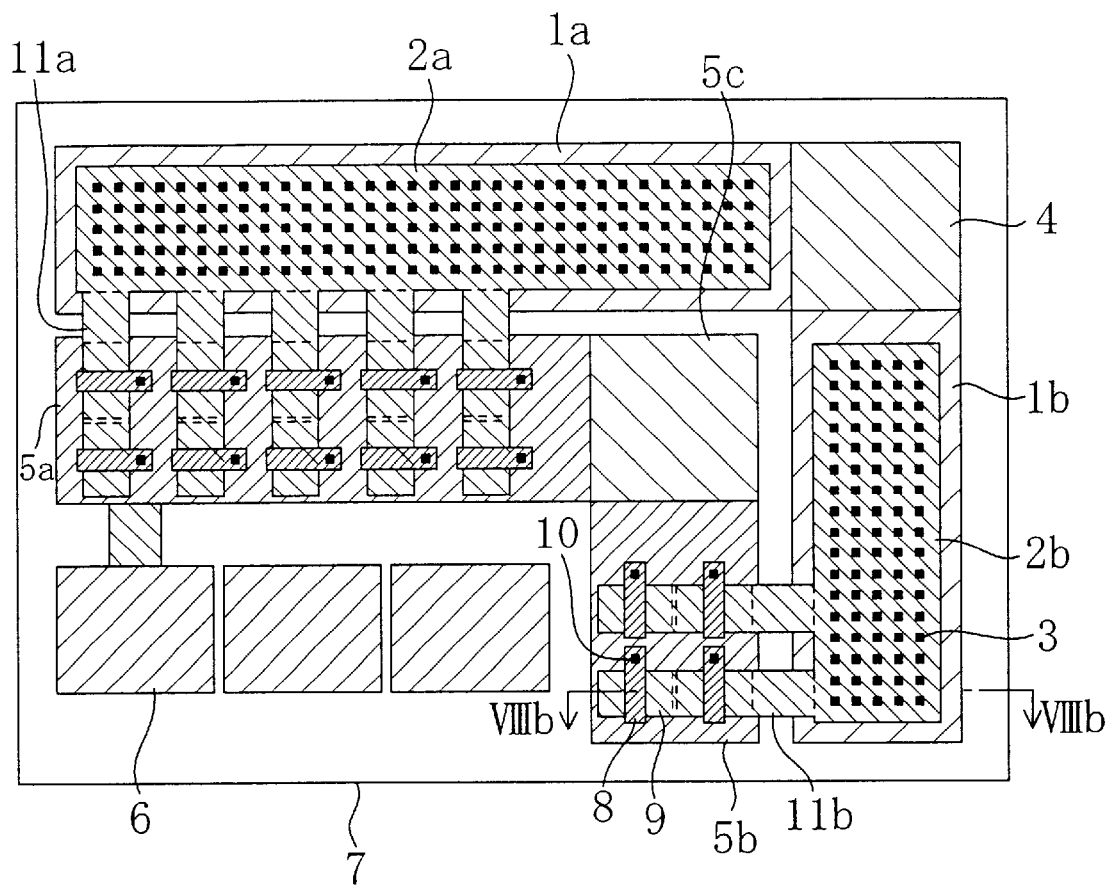
FIG. 8(a) is a plan view illustrating a final pattern defined for the semiconductor device according to the first embodiment.
Figure 8B:
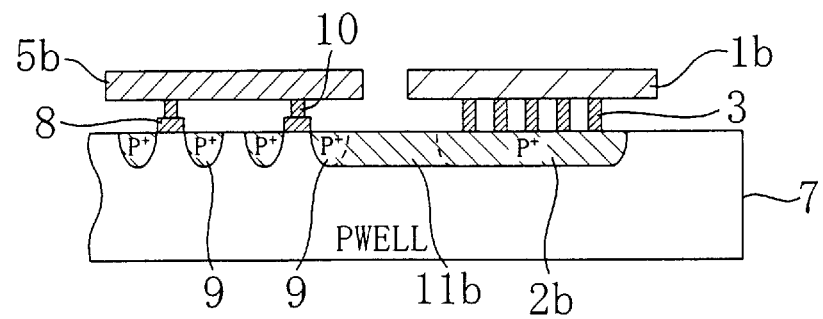
FIG. 8(b) is a partial cross-sectional view of the device taken along the line VIIIb—VIIIb in FIG. 8(a).

FIG. 8(a) is a plan view illustrating a final pattern defined for the semiconductor device in Sub-steps ST27 and ST28, and FIG. 8(b) is a partial cross-sectional view of the device taken along the line VIIIb—VIIIb in FIG. 8(a). In Sub-step ST27, regions (i.e., interconnecting diffused layers 11a, 11b), which are adjacent to both the bypass capacitor diffused layers 9 under the power lines 5a, 5b and the substrate contact diffused layers 2a, 2b under the ground lines 1a, 1b in the pattern shown in FIGS. 7(a) and 7(b) for the semiconductor device, are extracted based on the numerical technology data derived from the design rules using a layout verification tool, for example. That is to say, since the distance between the substrate contact diffused layer 2a, 2b and the bypass capacitor diffused layer 9 is unknown, the distance is derived using the layout verification tool. In this case, if the region in question is set longer than a value estimated from the technology, then an error indicating that the region is too short is output from the layout verification tool due to the separation check function thereof. Accordingly, those regions indicated as erroneous are defined as interconnecting diffused layers 11a and 11b.

Next, in Sub-step ST28, those regions are scaled up or down by half the minimum width of the diffused layers as defined by the technology derived from the design rules, thereby eliminating tiny patterns and defining the pattern shown in FIGS. 8(a) and 8(b) for the semiconductor device.

According to this embodiment, the bypass capacitor patterns located under the power line patterns 5a, 5b can be defined automatically. Thus, a pattern for a semiconductor device, which includes bypass capacitors contributing to reduction of power supply noise, can be created without increasing the overall area of the semiconductor chip. That is to say, the bypass capacitors can be inserted between the power supply and ground, which both usually increase the area of the semiconductor device. As a result, a circuit that can operate stably enough and can absorb a large proportion of the power supply noise is realized.

In this embodiment, after the layout of a semiconductor device has been defined, i.e., after the cells and lines thereof have been placed, the pattern for the semiconductor device is input in Step ST1. And then the patterns for the bypass capacitors are defined based on the pattern input. Accordingly, a series of processing steps can be performed automatically, not manually. That is to say, since the line patterns have already been fixed, the processing sub-steps ST21 through ST26 can be automated. This processing is also applicable even if there are no substrate contact through holes 3 or diffused layers 2a, 2b under the ground lines 1a, 1b.

Moreover, the diffused layers 11a, 11b are defined to interconnect together the bypass capacitor diffused layers 9 under the power lines 5a, 5b and the substrate contact diffused layers 2a, 2b under the ground lines 1a, 1b. Thus, the bypass capacitor diffused layers 9 and the substrate contact diffused layers 2a, 2b can be connected to each other via the layers 11a, 11b with a resistance lower than that of the substrate 7. Accordingly, if the impedance between the power supply and ground is lowered, then unwanted radiative noise involved with radio frequency operation can be reduced even more effectively.

Furthermore, bypass capacitors included in the horizontally arranged bypass capacitor array 14 are placed under the horizontal power line 5a, while bypass capacitors included in the vertically arranged bypass capacitor array 15 are placed under the vertical power line 5b. Thus, the interconnecting diffused layers 11a, 11b can be defined more easily in Sub-steps ST27 and ST28.

It should be noted, however, that the direction in which the power line 5a, 5b extends does not have to be the same as the direction in which the polysilicon electrodes 8 of the bypass capacitors located under the power line 5a or 5b extend. More specifically, if the bypass capacitors are rotated in Sub-step ST24 to such a direction as maximizing the width of the interconnecting diffused layers 11a, 11b defined in Sub-steps ST27 and ST28, then the bypass capacitors can be connected to the ground lines 1a, 1b with even lower resistance.

EMBODIMENT 2

Figure 9A:
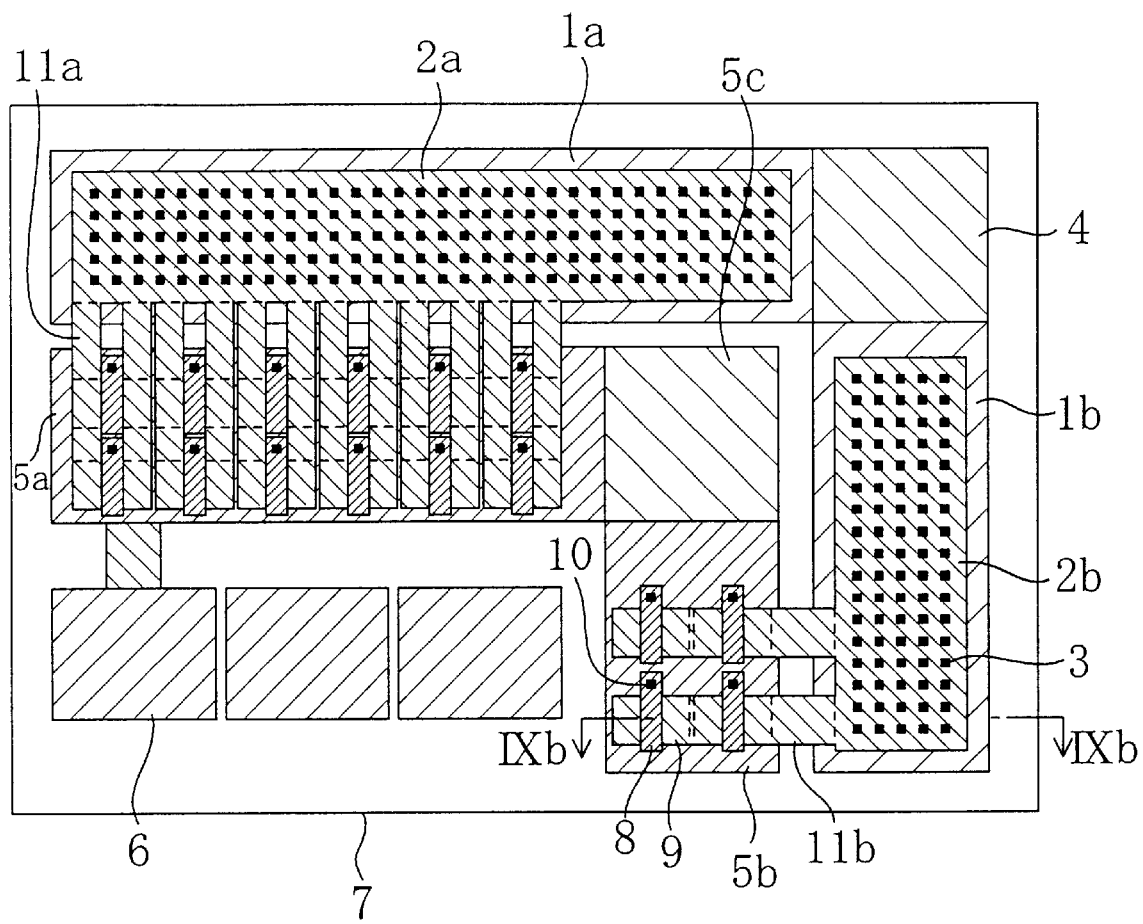
FIG. 9(a) is a plan view illustrating a final pattern defined for a semiconductor device according to a second embodiment of the present invention.
Figure 9B:
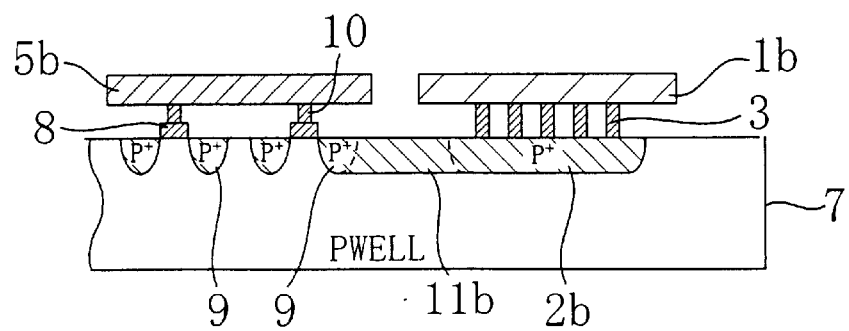
FIG. 9(b) is a partial cross-sectional view of the device taken along the line IXb—IXb in FIG. 9(a).

FIG. 9(a) is a plan view illustrating a final pattern that has been defined for a semiconductor device by a pattern forming method according to a second embodiment of the present invention. FIG. 9(b) is a partial cross-sectional view of the device taken along the line IXb—IXb in FIG. 9(a).

As shown in FIGS. 9(a) and 9(b), the structures of cells and lines for the semiconductor device of the second embodiment are the same as those of the semiconductor device of the first embodiment illustrated in FIGS. 8(a) and 8(b). But the device of the second embodiment is different from the device of the first embodiment in the following respects.

As shown in FIGS. 9(a) and 9(b), the polysilicon electrodes 8 of the bypass capacitors all extend vertically in the semiconductor device according to the second embodiment. The diffused layer 11b interconnecting together the substrate contact diffused layer 2b under the vertical ground line 1b and the bypass capacitor diffused layer 9 under the vertical power line 5b has the same pattern as that defined in the first embodiment. The diffused layer 11a interconnecting together the substrate contact diffused layer 2a under the horizontal ground line 1a and the bypass capacitor diffused layers 9 under the horizontal power line 5a is connected to the bypass capacitor diffused layers 9 on right- and left-hand sides of the polysilicon electrode 8 of a single bypass capacitor.

In this embodiment, the same basic procedure as that illustrated in FIG. 1 is adopted in forming a pattern. Specifically, the pattern is defined in the following manner.

According to the second embodiment, only the bypass capacitor array 15 shown in FIG. 3(b) is defined in Sub-step ST21. In Sub-step ST23, the horizontal and vertical virtual power line patterns 12a and 12b shown in FIGS. 4(a) and 4(b) are defined at a time in the virtual pattern forming region. And the logical operations are performed on the virtual power line patterns 12a, 12b and the bypass capacitor array 15, instead of the bypass capacitor arrays 13 and 14 shown in FIGS. 5(a) and 5(b). In this manner, the bypass capacitor frames 13b that are included in the virtual power line patterns 12a, 12b are obtained instead of the patterns shown in FIGS. 6(a) and 6(b). As a result, a pattern for a semiconductor device, where the bypass capacitors with polysilicon electrodes 8 extending in a single direction are placed under the power lines 5a, 5b irrespective of the directions in which the power lines 5a, 5b extend, is formed in Sub-step ST26. In Sub-steps ST27 and ST28, the pattern for the diffused layer 11b interconnecting together the substrate contact diffused layer 2b under the vertical ground line 1b and the bypass capacitor diffused layers 9 under the vertical power line 5b may be defined as in the first embodiment. The pattern for the diffused layer 11a interconnecting together the substrate contact diffused layer 2a under the horizontal ground line 1a and the bypass capacitor diffused layers 9 under the horizontal power line 5a is defined to be connected to the bypass capacitor diffused layers 9 on right- and left-hand sides of the polysilicon electrode 8 of each single bypass capacitor.

If the bypass capacitors, including the polysilicon electrodes 8 extending in the single direction, are placed under the power lines 5a, 5b in this manner, then the processing sub-step ST23 can be simplified. This is because in defining the virtual power line patterns 12a, 12b in Sub-step ST23, the horizontal and vertical power lines 5a and 5b do not have to be extracted separately.

EMBODIMENT 3

Figure 10A:
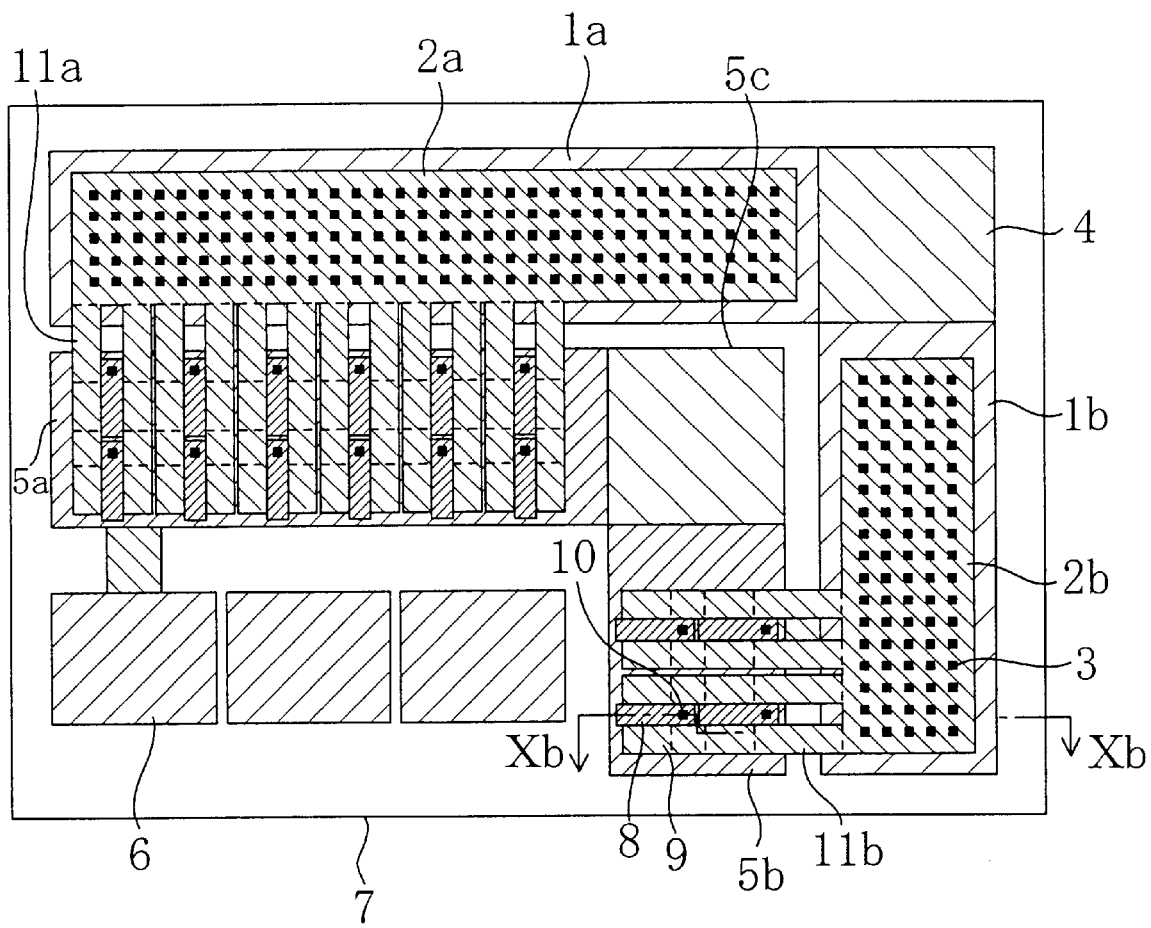
FIG. 10(a) is a plan view illustrating a final pattern defined for a semiconductor device according to a third embodiment of the present invention.
Figure 10B:
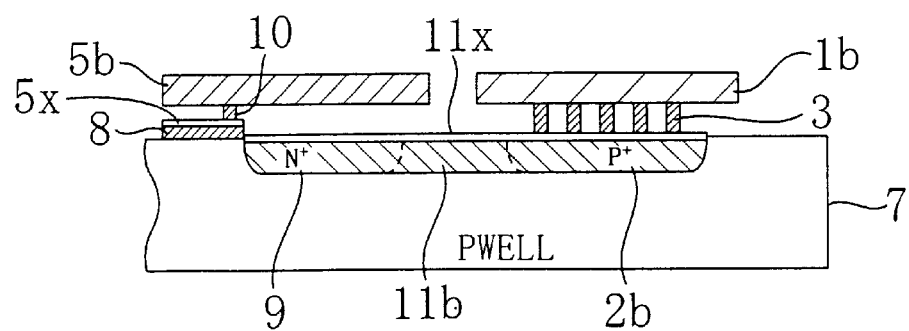
FIG. 10(b) is a partial cross-sectional view of the device taken along the line Xb—Xb in FIG. 10(a).

FIG. 10(a) is a plan view illustrating a final pattern that has been defined for a semiconductor device by a pattern forming method according to a third embodiment of the present invention. FIG. 10(b) is a partial cross-sectional view of the device taken along the line Xb—Xb in FIG. 10(a).

In the third embodiment, an MOS transistor of the conductivity type opposite to that of the semiconductor substrate 7 is formed as an exemplary bypass capacitor. As shown in FIGS. 10(a) and 10(b), the structures of cells and lines for the semiconductor device of the third embodiment are the same as those of the semiconductor device of the first embodiment illustrated in FIGS. 8(a) and 8(b). But the device of the third embodiment is different from the device of the first embodiment in the following respects.

In the semiconductor device according to the third embodiment, $p^+$-type substrate contact diffused layers 2a, 2b and $n^+$-type bypass capacitor diffused layers 9 are defined over the p-well. In such a case, since the conductivity type of the bypass capacitor diffused layers 9 is opposite to that of the substrate contact diffused layers 2a, 2b, a pn junction exists between them and therefore, these layers might not be electrically connected together satisfactorily as they are. Thus, according to the third embodiment, electrical connection between the bypass capacitor diffused layers 9 and the substrate contact diffused layers 2a, 2b is established through a salicidation process.

In this embodiment, the same basic procedure as that of the first embodiment illustrated in FIG. 1 is adopted to form a pattern, except that a salicidation process is adopted in Sub-steps ST27 and ST28 of defining the interconnecting diffused layers.

As in the first embodiment, the two types of bypass capacitor arrays 14 and 15 shown in FIGS. 3(a) and 3(b) are formed in Sub-step ST21, and the horizontal and vertical virtual power line patterns 12a, 12b shown in FIGS. 4(a) and 4(b) are extracted separately in the virtual pattern forming region in Sub-step ST23. However, the logical operations in Sub-step ST24 are performed on the horizontal virtual power line pattern 12a and the vertical bypass capacitor array 15 and on the vertical virtual power line pattern 12b and the horizontal bypass capacitor array 14, instead of the logical operations as illustrated in FIGS. 5(a) and 5(b). As a result, bypass capacitor frames 13b included within the horizontal virtual power line pattern 12a and bypass capacitor frames 13a included within the vertical virtual power line pattern 12b are defined in place of the patterns shown in FIGS. 6(a) and 6(b). And in Sub-step ST26, a pattern for a semiconductor device, where bypass capacitors with polysilicon electrodes 8 extending vertically are placed under the horizontal power line 5a and bypass capacitors with polysilicon electrodes 8 extending horizontally are placed under the vertical power line 5b, is defined.

In Sub-steps ST27 and ST28, the patterns for the diffused layer 11a interconnecting together the bypass capacitor diffused layers 9 under the horizontal power line 5a and the substrate contact diffused layer 2a and the diffused layer 11b interconnecting together the bypass capacitor diffused layers 9 under the vertical power line 5b and the substrate contact diffused layer 2b are both defined to be connected to the bypass capacitor diffused layers 9 on right- and left-hand sides of the polysilicon electrode 8 of each single bypass capacitor. Also, as shown in FIG. 10(b), a pattern for a semiconductor device, where the surface regions of the substrate contact diffused layer 2a, 2b, bypass capacitor diffused layers 9 and interconnecting diffused layer 11a, 11b are covered with an on-diffused-layer silicide film 11x and the surface region of the bypass capacitor polysilicon electrode 8 is covered with an on-electrode silicide film 5x, is defined.

However, in Sub-step ST27, sums of the patterns for the bypass capacitor diffused layers 9 placed under the horizontal power line 5a and the substrate contact diffused layer 2a placed under the horizontal ground line 1a are obtained through logical operations and grouped. Then, a pattern is defined so as to fill in the vertical separation of the grouped patterns by utilizing the separation check function such as a layout verification tool. In the same way, sums of the patterns for the bypass capacitor diffused layers 9 placed under the vertical power line 5b and the substrate contact diffused layer 2b placed under the vertical ground line 1b are also grouped. Then, a pattern is defined so as to fill in the horizontal separation of the grouped patterns. Then, in resizing sub-step ST28, the pattern defined in Sub-step ST27 is scaled up or down by half the minimum width of the diffused layer based on the technology derived from the design rules, thereby eliminating tiny patterns and defining the interconnecting diffused layers 11a, 11b.

Finally, the bypass capacitor frames 13 are output as ion-implanted regions that have been doped with a dopant of the conductivity type opposite to that of the p-well within the substrate 7.

In this manner, all the bypass capacitor diffused layers 9 can be electrically connected to the substrate contact diffused layers 2a, 2b without making any of the bypass capacitor diffused layers 9 float electrically. That is to say, even if an MOS transistor of the same conductivity type as that of the substrate 7 (i.e., the p-well) cannot be formed in a semiconductor device fabrication process, the bypass capacitors can still be placed automatically under the power lines 5a, 5b.

EMBODIMENT 4

Figure 11:
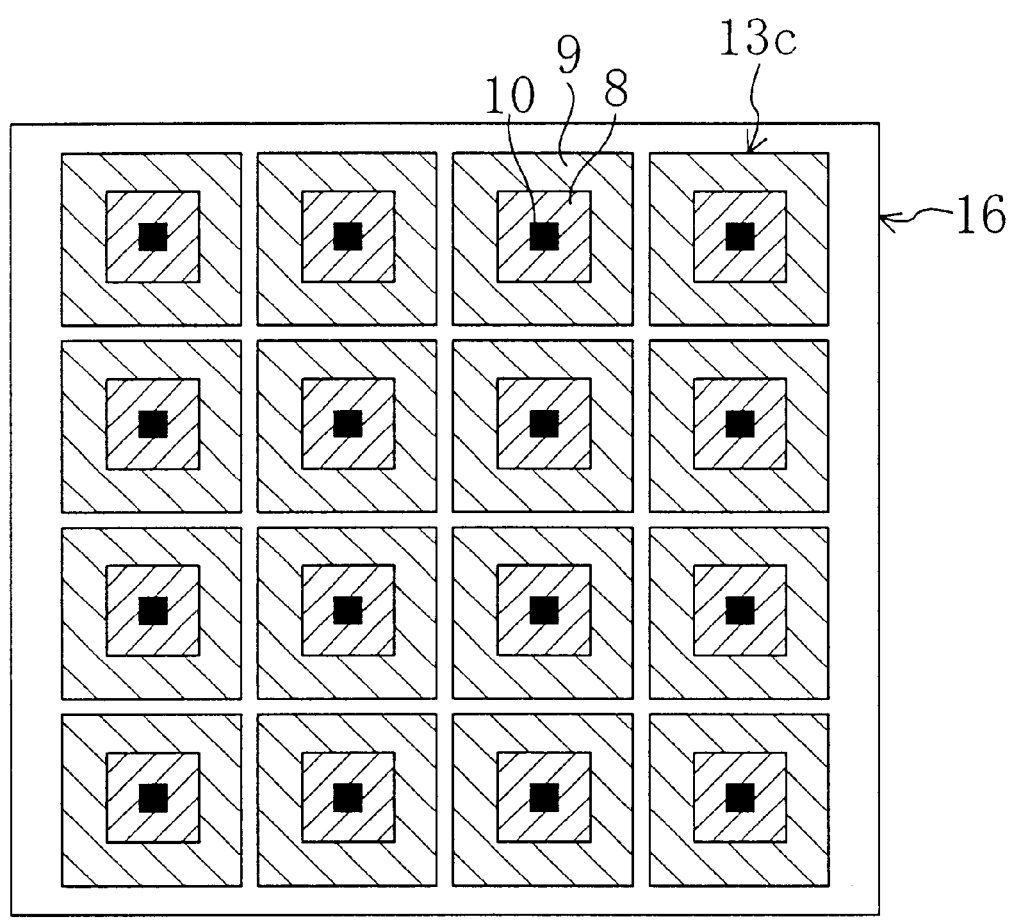
FIG. 11 is a plan view illustrating a pattern for a bypass capacitor array according to a fourth embodiment of the present invention.
Figure 12A:
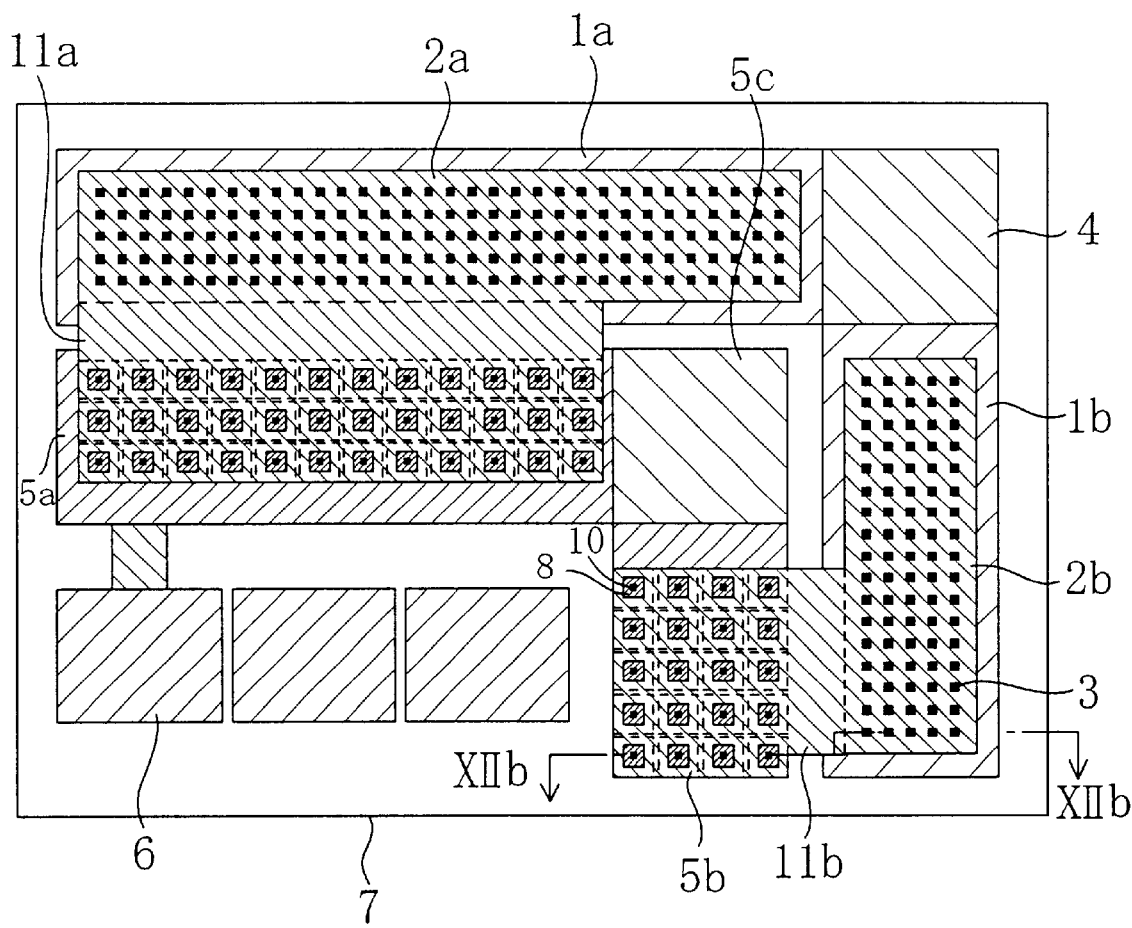
FIG. 12(a) is a plan view illustrating a final pattern defined for a semiconductor device according to the fourth embodiment.

FIG. 11 is a plan view illustrating a pattern for a bypass capacitor array according to a fourth embodiment of the present invention. FIG. 12(a) is a plan view illustrating a final pattern that has been defined for the semiconductor device by a pattern forming method according to the fourth embodiment. And FIG. 12(b) is a partial cross-sectional view of the device taken along the line XIIb—XIIb in FIG. 12(a).

As shown in FIG. 11, each bypass capacitor according to the fourth embodiment includes: a rectangular polysilicon electrode 8; a bypass capacitor diffused layer 9 formed to surround the polysilicon electrode 8; and a bypass capacitor through hole 10 provided on the polysilicon electrode 8.

Figure 12B:
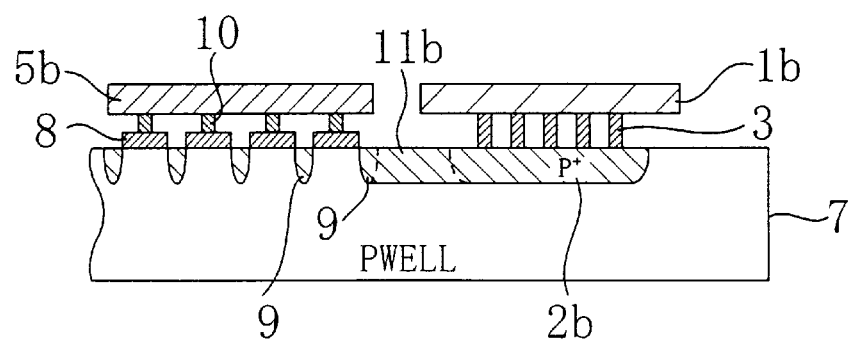
FIG. 12(b) is a partial cross-sectional view of the device taken along the line XIIb—XIIb in FIG. 12(a).

As shown in FIGS. 12(a) and 12(b), the structures of cells and lines for the semiconductor device of the fourth embodiment are the same as those of the semiconductor device of the first embodiment illustrated in FIGS. 8(a) and 8(b). But the device of the fourth embodiment is different from the device of the first embodiment in the following respects.

In the semiconductor device according to the fourth embodiment, the diffused layer 11a, 11b interconnecting together the substrate contact diffused layer 2a, 2b under the ground line 1a, 1b and the bypass capacitor diffused layers 9 under the power line 5a, 5b is provided in such a manner as connecting all the bypass capacitor diffused layers 9 arranged in line to face the ground line 1a, 1b (in the planar layout) to the substrate contact diffused layer 2a, 2b.

Although not shown, a pattern for an MOS transistor in the cell also includes: a pattern for a ringlike polysilicon electrode; and a pattern for a source/drain diffused layer formed in a region surrounded by the polysilicon electrode and a region surrounding the polysilicon electrode.

In the fourth embodiment, the same basic procedure as that of the first embodiment illustrated in FIG. 1 is adopted to form a pattern.

According to the fourth embodiment, only the bypass capacitor array 16 including the ringlike polysilicon electrodes 8 as shown in FIG. 11 is formed in Sub-step ST21. In Sub-step ST23, the horizontal and vertical virtual power line patterns 12*a* and 12*b*, instead of those shown in FIGS. 4(*a*) and 4(*b*), are extracted at a time in the virtual pattern forming region. And the logical operations are performed on the horizontal and vertical virtual power line patterns 12*a*, 12*b* and the bypass capacitor array 16, instead of the bypass capacitor arrays 13 and 14 shown in FIGS. 5(*a*) and 5(*b*). In this manner, the bypass capacitor frames 13*c* that are included in the virtual power line patterns 12*a*, 12*b* are obtained instead of the patterns shown in FIGS. 6(*a*) and 6(*b*). As a result, a pattern for a semiconductor device, where the bypass capacitors with the ringlike polysilicon electrodes 8 are placed under the power lines 5*a*, 5*b*, is defined in Sub-step ST26.

In Sub-steps ST27 and ST28, the patterns for the diffused layers 11*a*, 11*b* interconnecting together the bypass capacitor diffused layers 9 surrounding the polysilicon electrodes 8 and the substrate contact diffused layers 2*a*, 2*b* are defined to have a broad width.

However, in Sub-step ST27, sums of the patterns for the bypass capacitor diffused layers 9 placed under the horizontal power line 5*a* and the substrate contact diffused layer 2*a* placed under the horizontal ground line 1*a* are obtained through logical operations and grouped. Then, a pattern is defined so as to fill in the vertical separation of the grouped patterns by utilizing the separation check function such as a layout verification tool. In the same way, sums of the patterns for the bypass capacitor diffused layers 9 placed under the vertical power line 5*b* and the substrate contact diffused layer 2*b* placed under the vertical ground line 1*b* are also grouped. Then, a pattern is defined so as to fill in the horizontal separation of the grouped patterns.

In the semiconductor device according to the fourth embodiment in which the bypass capacitors with the ringlike polysilicon electrodes 8 are placed, the horizontal and vertical virtual power line patterns 12*a*, 12*b* do not have to be defined in the virtual pattern forming region separately. Accordingly, there is no need to resize the power line patterns and the processing can be simplified. In addition, the bypass capacitors can be placed under the power lines 5*a*, 5*b* with no gaps formed between the capacitors, thus increasing the capacitance available. Furthermore, the width of the interconnecting diffused layer 11*a*, 11*b* interconnecting together the bypass capacitor diffused layers 9 and the substrate contact diffused layer 2*a*, 2*b* can be broadened. As a result, bypass capacitor with even lower resistance can be connected thereto.

In the foregoing embodiment, the polysilicon electrode of the bypass capacitor is illustrated as being rectangular or square. However, the shape of the electrode for the bypass capacitor is not limited to such a specific one according to the present invention. For example, the electrode may be hexagonal, triangular or circular.

What is claimed is:

1. A method for forming a layout pattern for a semiconductor device automatically, the method comprising the steps of:
    a) defining a layout, which includes a pattern for a cell with a MIS structure and patterns for power and ground lines, over a semiconductor substrate; and
    b) automatically creating patterns for bypass capacitors with a MIS structure such that the patterns for the capacitors overlap with the pattern for the power line, each said bypass capacitor including the semiconductor substrate, a capacitive insulating film and an electrode.

2. The method of claim 1, wherein a pattern for a first diffused layer, which is provided on right- and left-hand sides of the electrode, is included in the pattern for each said bypass capacitor, and
    wherein the ground line is connected to a second diffused layer in the semiconductor substrate via substrate contacts, and
    wherein the method further comprises the step of c) creating a pattern for a third diffused layer interconnecting the first diffused layer of the bypass capacitors and the second diffused layer together.

3. The method of claim 1, wherein the step b) comprises the sub-steps of:
    x) preparing at least one pattern for an array of bypass capacitors;
    y) extracting the pattern for the power line from the layout; and
    z) superimposing the pattern for the power line on the pattern for the bypass capacitor array and extracting, as the pattern for the bypass capacitors, part of the pattern for the bypass capacitor array that overlaps with the pattern for the power line.

4. The method of claim 3, wherein in the sub-step x), patterns for two types of bypass capacitor arrays are prepared, each of the patterns being in the form of a rectangle where the electrodes of the bypass capacitors extend in a predetermined direction, the direction in which the electrodes extend in one of the two patterns crossing at right angles with the direction in which the electrodes extend in the other pattern, and
    wherein in the sub-step z), the patterns for the bypass capacitors are defined such that the electrodes of the bypass capacitors are parallel to the power line.

5. The method of claim 3, wherein in the sub-step x), patterns for two types of bypass capacitor arrays are prepared, each of the patterns being in the form of a rectangle where the electrodes of the bypass capacitors extend in a predetermined direction, the direction in which the electrodes extend in one of the two patterns crossing at right angles with the direction in which the electrodes extend in the other pattern, and
    wherein in the sub-step z), the patterns for the bypass capacitors are defined by rotating the bypass capacitors in such a direction as maximizing the area of an interconnecting diffused layer.

6. The method of claim 3, wherein in the sub-step x), a single pattern for the bypass capacitor array is prepared, the pattern being in the form of a rectangle where the electrodes of the bypass capacitors extend in a predetermined direction, and
    wherein in the sub-step z), the patterns for the bypass capacitors are defined such that the electrodes of some of the bypass capacitors are parallel to the power line and the electrodes of the other bypass capacitors cross at right angles with the power line.

7. The method of claim 3, wherein in the pattern for the bypass capacitor array prepared in the sub-step x), each said electrode is ringlike, and the first diffused layer exists in a region surrounded by the electrodes and in a region outside of the electrodes.

8. The method of claim 3, wherein in the sub-step x), a single pattern for the bypass capacitor array is prepared, the pattern being in the form of a rectangle where the electrodes of the bypass capacitors extend in a predetermined direction,
    wherein in the sub-step z), the patterns for the bypass capacitors are defined such that the electrodes of some of the bypass capacitors are parallel to the power line and the electrodes of the other bypass capacitors cross at right angles with the power line, and
    wherein a diffused layer of the bypass capacitors is in a form of a rectangle having a rectangular hollow therein.

* * * * *